United States Patent [19]

Couvrette

[11] Patent Number: 4,813,475
[45] Date of Patent: Mar. 21, 1989

[54] TEMPERATURE CONTROL MEANS FOR A SELF SERVICE BANKING SYSTEM

[76] Inventor: Edward F. Couvrette, 585 Vernon Way, El Cajon, Calif. 92020

[21] Appl. No.: 164,830

[22] Filed: Mar. 7, 1988

[51] Int. Cl.$^4$ .......................... G07G 5/00; F28F 3/14; E04H 9/00; F25B 29/00
[52] U.S. Cl. ........................................ 165/21; 165/27; 165/48.1; 165/59; 109/2; 109/24.1
[58] Field of Search .................... 165/21, 27, 48.1, 59; 109/2, 24.1, 49.5

[56] References Cited

U.S. PATENT DOCUMENTS

| | | | |
|---|---|---|---|
| 3,547,348 | 12/1970 | Kruper | 165/21 |
| 4,179,723 | 12/1979 | Spencer | 109/24.1 |
| 4,399,755 | 8/1983 | Wiedmann | 109/2 |
| 4,475,465 | 10/1984 | Hastings | 109/2 |
| 4,497,261 | 2/1985 | Ferris et al. | 109/2 |
| 4,603,643 | 8/1986 | Couvrette | 109/2 |
| 4,662,288 | 5/1987 | Hastings et al. | 109/2 |
| 4,681,044 | 7/1987 | Dallman | 109/24.1 |

Primary Examiner—Albert W. Davis, Jr.
Assistant Examiner—John K. Ford
Attorney, Agent, or Firm—Frank D. Gilliam

[57] ABSTRACT

Self service banking system including a walk-in kiosk housing an Automatic Teller Machine (ATM). The kiosk includes a pivotable interior access door on one end thereof which is pivotable between open and closed positions and a side wall rotatable quarter panel expansion area for allowing access to the interior of the ATM. The kiosk provides a secure enclosed environment for the automatic teller machine (ATM) and its contents. An air distribution system, a laminated wall insulation, heating and cooling systems and their controls are provided to maintain the interior temperature and humidity of the kiosk within the normal temperature and humidity operational range of the computer of the ATM during exposure of the kiosk to a wide range of ambient temperatures and humidity beyond the acceptable operating temperature and humidity range of the ATM and its computers.

11 Claims, 2 Drawing Sheets

TEMPERATURE CONTROL MEANS FOR A SELF SERVICE BANKING SYSTEM

BACKGROUND OF THE INVENTION

Field of the invention

This invention relates to a self service banking system kiosk which houses an automated teller machine (ATM) and more particularly to a cooling and heating system, air distribution humidity control and insulation of the kiosk housing to maintain the kiosk interior at a temperature and humidity within the normal operating temperature and humidity of the ATM and computer during extreme ambient weather conditions where exterior temperatures and humidity exceed the operational maximum and minimum range of the ATM.

Consideration o space and security very much effect and limit the usefulness of automatic teller machines for banking services. Originally, these machines were only installed within the principal premises of the institutions where ambient temperatures and humidity remained substantially constant. More recently, however, these machines are being installed at locations remote from the principal banking premises. Such as, driveways adjacent thereto, shopping centers, parking lots, etc., both for walk-up and vehicle drive-up applications. The space consideration requires that the kiosk housing an ATM be made as physically small as possible and yet adequately enclose the ATM. The need for security is obvious. A less obvious factor is the need to closely control the operating environment surrounding the ATM. A significant portion of ATM's is a small computer. It is this computer which must be maintained within a narrow range of temperatures and humidity.

DESCRIPTION OF THE PRIOR ART

Generally stated, existing kiosks are constructed of metal and concrete with the front surface of the ATM exposed to the elements. Obviously all of these metal surfaces act as "heat sinks" which are very conductive to exposed environmental temperature. To accommodate moderate temperature changes air cooling refrigerator and air heating units are provided to lower or raise the internal kiosk temperature to maintain the ATM within its normal temperature operating range; However, it has been found that in areas where ambient temperature varies over an extremely wide temperature range the temperature conditioning systems generally used are inadequate to maintain the ATM within the required operating temperature range. Larger BTU air refrigerator units and heaters have been tried with little or no success when ambient temperature range variations between −40 degrees and 125 degrees F. In the South where extreme high temperatures are encountered, a kiosk placed in direct sun light can experience external surface temperatures in excess of 160 degrees F. The presently configured kiosks are ineffective in keeping the ATM temperature within its normal operating temperature range under such external temperature conditions. Sufficiently large air refrigeration and heating units that would be required to approach temperature control within the required temperature range under external hot and cold conditions are too bulky for use within a small profile kiosk and in addition would be extremely expensive to install and operate.

Typical advanced designed kiosks having internal air refrigeration and heating units that are found to be inadequate to maintain operation level temperatures in severe environmental conditions can be found in U.S. Pat. Nos. 4,399,755 and 4,497,261.

None of these prior art teachings address humidity changes which occur within the kiosk due to the effect of refrigeration and heat on ambient air circulated with a kiosk during temperature control.

There has not been a suitable temperature and humidity controlled kiosk for use in severe environments until the emergence of the improved kiosk of this invention.

SUMMARY OF THE INVENTION

This invention is directed to the severe environment control of a structure for housing an ATM which includes heating, cooling, ducting, and insulation means capable of maintaining the computer of the ATM within its normal operating temperature and humidity range when positioned in an environment having a range of extreme temperatures and high humidity which is economical to operate.

The invention is directed to the use of an ATM in a conventionally constructed kiosk having a minimum exterior dimensions which have popular current usage that is suitable for all weather outdoor use. Conventionally the ATM has one surface exposed to customer access and the remaining surfaces are positioned closely adjacent to the inside surface of the walls of the kiosk. An entry door is provided that pivots approximately 90 degrees to allow access to the interior of the kiosk for servicing the ATM by authorized personnel.

An air circulating system is provided that circulates conditioned air under and over the exterior surfaces of the ATM within the enclosure. Layers of different types of insulation material are positioned between the interior metal surfaces of the kiosk and the air circulation system flow path. Five heaters are utilized. Four heaters are located within a refrigeration air conditioning unit positioned above the ATM and the other is positioned in the air circulation flow path below the ATM. In some temperature locations the flow path heater is not required.

A blower is utilized to force conditioned air through the air circulation path. Temperature sensing means are positioned in the air circulation flow path near the ATM for controlling the operation of the heaters and air cooling refrigeration unit. A humidistat is positioned within the air conditioner external air duct to monitor the incoming air and to energize one of the four 900 watt heaters located in the incoming air duct. A novel air flow guide vane is carried by the rotatable side quarter panel and rotates to an angled upright position for deflecting air flow through internal door apertures to an opening in the bottom of the kiosk access door when the quarter panel is in a closed minimum exterior position and rotates to a horizontal position, closing off the opening in the bottom of the kiosk access door when the side quarter panel is rotated outward for ATM access.

An object of this invention is to provide a minimum exteriorly dimensioned kiosk for containing the maximum sized ATM that maintains the ATM at operational temperature and humidity under severe environmental conditions of extremely low and high temperatures and humidity.

Another object of this invention is to maintain an ATM at its normal operating temperature and humidity level under severe environmental conditions of extremely low and high temperatures while expending only a minimal amounts of energy.

The above and other objects of this invention will become apparent in the description below enrich like parts or elements in the drawing figures in which:

BRIEF DESCRIPTION OF THE DRAWING FIGURES

DETAILED DESCRIPTION OF THE PROFFER EMBODIMENT

Referring now to the various drawing Figures.

Figure 1:
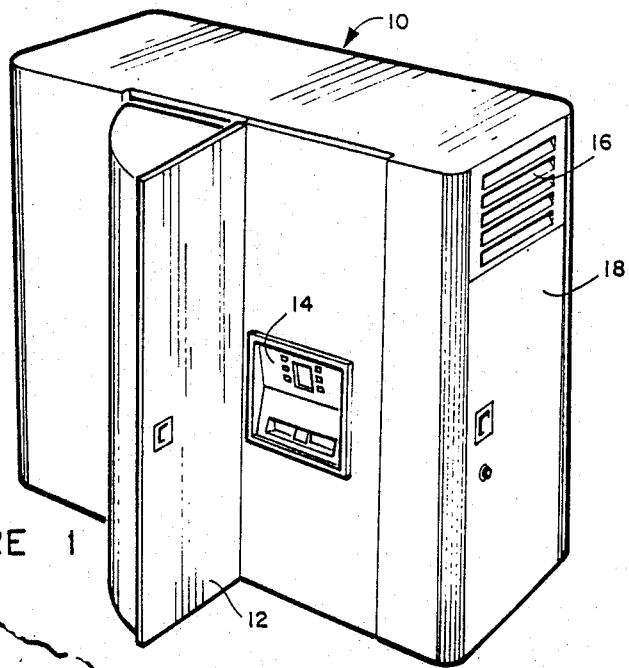
FIG. 1 is a perspective showing of the kiosk of the invention with the side wall rotatable quarter panel rotated to an outward position.

FIG. 1 is a perspective showing of the exterior of the kiosk 10 of the invention showing rotatable side wall quarter panel extension, 12, an ATM 14 (which contains a computer, not shown), an air cooling refrigeration unit air vent 16 and a rear entry door 18.

Figure 2:
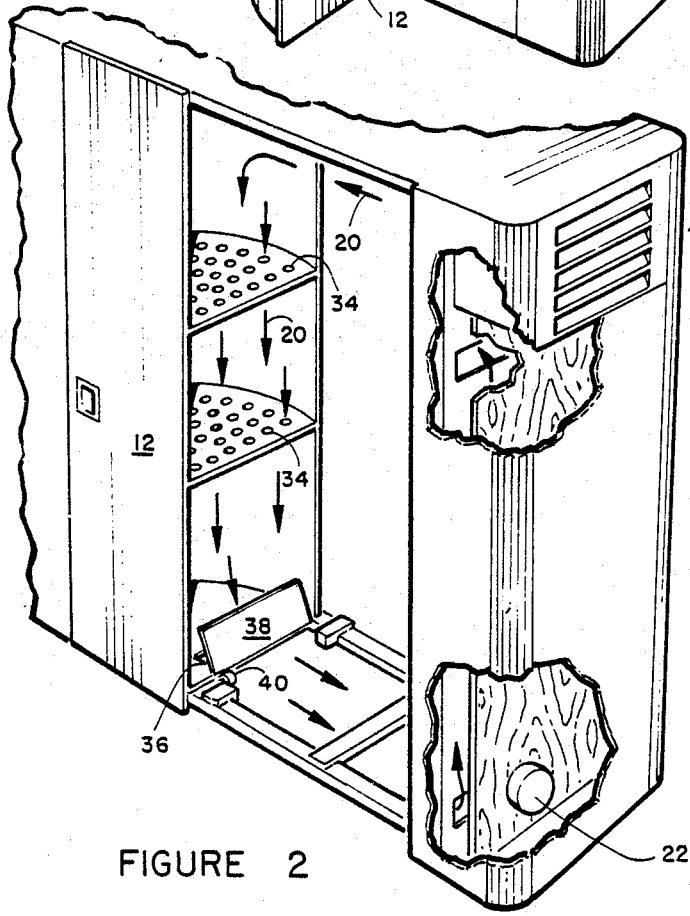
FIG. 2 is a partial cutaway perspective of the kiosk of FIG. 1 with the side wall rotatable quarter panel in a closed position with the ATM omitted to expose air flow path.
Figure 4:
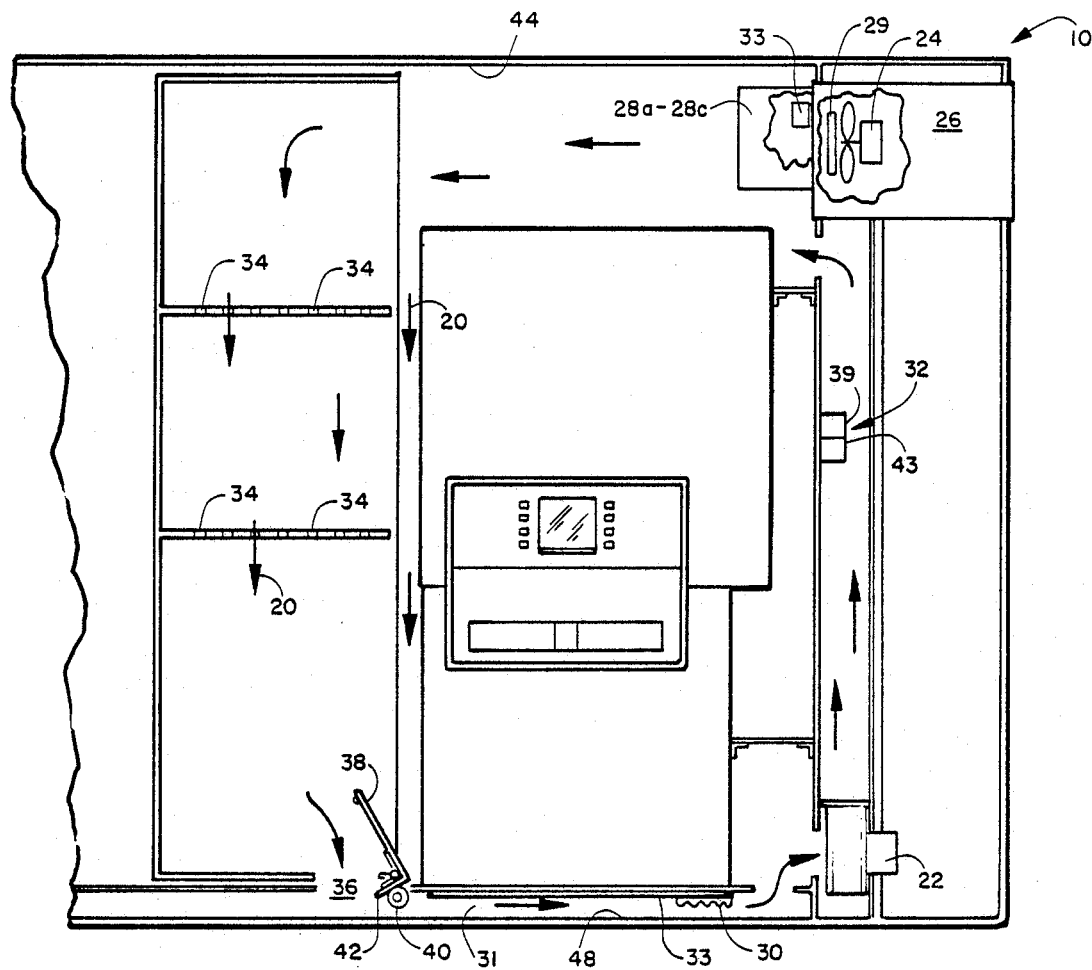
FIG. 4 is a partial side view showing of the kiosk depicting the circulating air flow path and details of the insulation material layers adjacent the interior kiosk wall structure.
Figure 7:
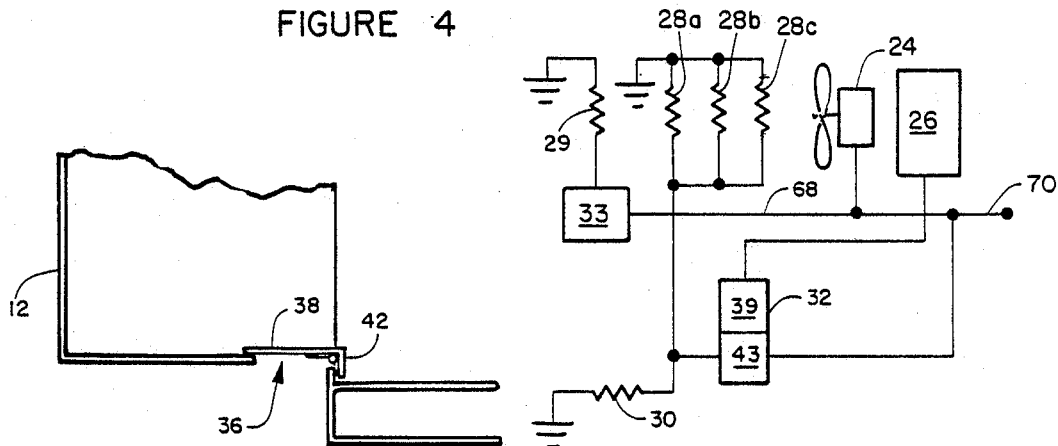
FIG. 7 is a schematic diagram of the control system for the heater and air conditioner.

FIG. 2 and FIG. 4 depict a perspective and side showing respectively of the showing of FIG. 1 with the rotatable entry door 12 rotated to a closed position. The arrows 20 indicate the direction of the conditioned air flow within the kiosk 10. An auxiliary blower 22 in the range of 200-350 CFM is the primary conditioned air handling means of the system. The air handling by the blower is assisted by a small fan 24 located within the air cooling refrigeration unit 26. The air cooling refrigeration unit has a cooling capacity in the range of 5000 to 12000 BTU. A refrigeration unit of this cooling range is found to provide sufficient cooling with kiosk outside ambient temperatures as high as 125 degrees F. The air cooling refrigeration unit 26 and the internal heaters 28a-28c and the heater 29 for humidity control are shown schematically in FIG. 7. Also shown in the last mentioned Figure is the heating element 30 which is positioned beneath the ATM in the lower air flow duct 31. The heater 30 may not be required in some geographic areas. Heaters 28a-28c are approximately 8000 to 15000 BTU's and heater unit 30 is approximately 8000 to 15,000 BTU's. Heater 29 is approximately 900 watts. It has been determined that the location of the heaters and their combined BTU levels maintain the interior of the kiosk and the ATM at ATM operating temperature with kiosk outside ambient temperatures at 35 degrees below zero and maintain proper humidity levels within the kiosk at all humidity levels.

An air flow temperature control unit 32 is located within the air flow path at the side of the ATM adjacent to the blower 22. A humidistat 33 is located within the air conditioner incoming air duct and monitors the humidity of incoming air.

Figure 3:
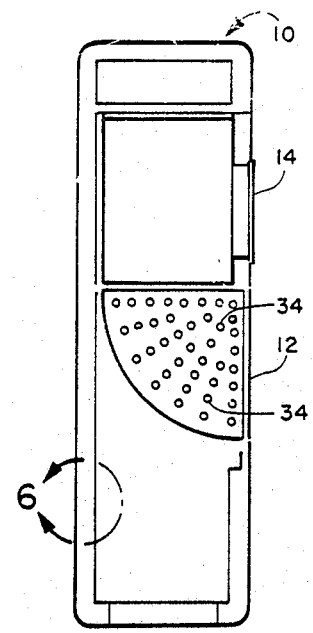
FIG. 3 is a showing of the kiosk taken along line 3—3 of FIG. 2.
Figure 5:
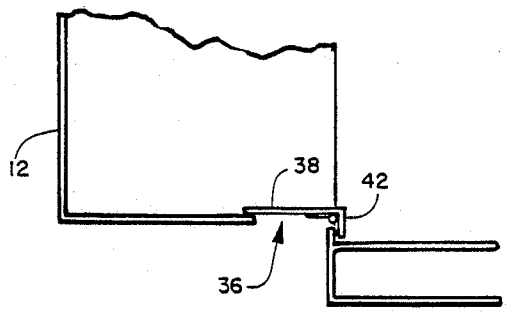
FIG. 5 is a showing of the rotatable air flow direction vane shown in the interior entry door open position.

As can be seen in FIGS. 2 through 4, perforations 34 are located within the structure of the rotatable kiosk side quarter panel 12 for providing a conditioned air circulating within the kiosk to flow around the top and bottom of the ATM through the door structure and along the side surface of the ATM adjacent the entry door. An opening 36 is provided in the bottom of the door 12 to direct conditioned air flow beneath the ATM. The opening 36, seen in FIG. 5, is closed by the pivotal door 38 when the side quarter panel 12 is in the FIG. 1 position. A roller 40, see FIG. 4, attached to fixed structure of the kiosk 10, is positioned to contact the end surface 42 of door 38, causing door 38 to rotate upwardly to the position shown in FIGS. 2 and 4 when the kiosk side quarter panel 12 is rotated to its closed or minimum outside profile. The door 38 in the last mentioned position directs or guides the conditioned air flow through the opening 36 provided by the rotation of door 38 and hence along arrows 20 beneath the ATM.

Referring again to FIG. 4, the temperature control circuit 32 for controlling the conditioned the air is positioned within the air flow path. The control circuit contains thermostats 39 and 43. Thermostat 39 controls the high temperature and thermostat 43 controls the low temperature extreme within which the ATM is designed to operate. These thermostats have a range between heat on and cooling on settings. When the circulating air temperature is below the low temperature setting of thermostat 43, the heaters 28 are energized and when the circulating air is higher than the setting of the high temperature of thermostat 39, the air cooling refrigeration unit 26 is energized. The blower 22 and fan 24 are energized at all times the ATM is available for banking.

Referring still to FIG. 4, a humidistat 33 includes internal controls for energizing heater 29 when the humidity level of the incoming air to the air conditioner exceeds a predetermined or pre-sil level. The humidistat is connected in series between the source of incoming power to the kiosk and the heater 29. The heater 29 lowers the relative humidity of the incoming air prior to entry into the air circulation system.

Figure 6:
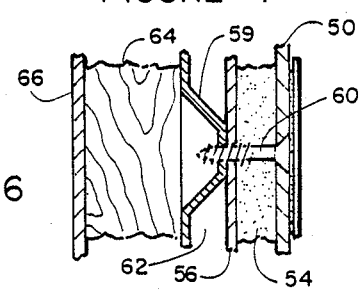
FIG. 6 is a showing taken along line 6—6 of FIG. 3.

Referring again to FIGS. 4 and to FIG. 6 which is a detailed cutaway view showing taken along line 6—6 of FIG. 3 depicting the novel placement of insulation material separating the air flow path and the walls of the ATM from ambient outside air temperatures. The upper and lower inner surfaces 44 and 48 respectively of the kiosk include approximately three and one half inch layer and a seven eights inch layer of foam material. This foam is typically urethane foam or an equivalent thereto. The side walls of the kiosk are layered from the inner outside surface towards the ATM with several layers of different materials. The first layer comprises a sandwich formed with a first sheet of MASONITE 50 of approximately 0.25 inches thick and a second sheet of MASONITE 56 of approximately 0.125 inches thick sandwiched therebetween is a layer of foam 54 of about one inch thick. The sandwich structure is attached to an internal protruding frame members 59 by means of fasteners 60, shown as screws. Any type fastening means may be used. A dead air space 62 is provided to separate the sandwich structure from a second layered panel of foam 64 of approximately 1.5 inches in thickness and a sheet of construction dry wall material 66 of a thickness of approximately one-half inch. The dimensions of the various materials and dead air space may be slightly varied and still be suitable to practice the invention.

The dimensions of the kiosk depend on the actual physical dimensions of a given sized ATM. The minimum width of the kiosk is determined by the depth of the ATM plus the depth of the required layers of insulation.

Internal electrical lines 68 operate the various controls, heaters and air conditioning elements. The operating power is connected through power line 70 to an external source not shown.

A kiosk designed according to the above described construction is suitable to maintain the normal required operating temperatures and humidity levels of the ATM while encountering ambient temperatures outside of the kiosk in the range of minus 40 degrees to 125 degrees F and humidity levels of 100%.

As various changes could be made on the above described insulation and air handling system without departing from the scope of the invention it is intended that all matter contained in the above description or shown in the accompanying drawing shall be interpreted as illustrators and not in a limiting sense.

What is claimed is;

1. Temperature control means for a self service banking system comprising;
    a metal enclosure having an access door and a side opening;
    an automatic teller machine positioned within said metal enclosure with one exposed surface through said side opening;
    layers of spaced apart insulation material separating said automatic teller from the exterior surface of said metal enclosure on all sides of said automatic teller machine except said exposed surface;
    means forming an air flow path located between the inner surface of said layers of insulation material and said automatic teller machine along the top, ends and bottom surfaces thereof;
    air conditioning means including a refrigeration unit for cooling incoming air and at least one heater unit positioned with said refrigeration unit, said refrigeration being positioned above said automatic teller machine;
    a heater element positioned below said automatic teller machine; and
    air conditioning control means comprising a high and a low temperature thermostat positioned within said air flow path for energizing said refrigeration unit when said air in said flow path exceeds the setting of said high temperature and for energizing said heater units and when the temperature of said air iu said air flow path is less than the setting of said low temperature thermostat.

2. The invention as defined in claim 1 wherein said automatic teller machine has at least two sides closely adjacent to the walls of said metal enclosure.

3. The invention as defined in claim 1 wherein said layers of insulation material comprises foam insulation material sandwiched between two sheets of MASONITE, a dead air space and a combined layer of foam and a sheet of construction dry wall.

4. The invention as defined in claim 1 wherein the BTU rating of said refrigeration unit is in the range of 5000 to 10,000.

5. The invention as defined in claim 1 wherein the BTU rating of said heater unit positioned in said refrigeration unit is in the range of 8000 to 15,000.

6. The invention as defined in claim 1 wherein the BTU rating of said heater unit positioned below said automatic teller machine is in the range of 8000 to 15,000.

7. The invention as defined in claim 1 wherein said layers of spaced apart insulation material comprises is urethane foam.

8. The invention as defined in claim 1 wherein said metal housing further comprises side wall rotatable quarter panel expansion area, said side wall rotatable quarter panel expansion area includes a plurality of horizontal shelves each with a plurality of air passages therethrough and a rotatable panel positioned in the floor of said side wall rotatable quarter panel expansion area is rotated to a downward position when said rotatable quarter panel extension area is rotated to an outwardly extended position and rotates upwardly away from and at an angle with said floor exposing an opening through said floor and forming a direction guide for conditioned air entering under said automatic teller machine when said rotatable quarter panel is rotated closed.

9. The invention as defined in claim 1 further comprises an air circulating means comprising a fan located in said refrigeration unit and a blower unit positioned below said refrigeration unit.

10. The invention as defined in claim 9 additionally comprising control means for energizing said blower unit and fan at all times.

11. The invention as defined in claim 1 further comprises at least a second heater unit and a humidity control means for selectively energizing said at least said second heater unit for lowering the relative humidity incoming ambient air.

* * * * *